United States Patent
Yamaguchi et al.

(10) Patent No.: US 7,332,255 B2
(45) Date of Patent: Feb. 19, 2008

(54) OVERLAY BOX STRUCTURE FOR MEASURING PROCESS INDUCED LINE SHORTENING EFFECT

(75) Inventors: Yuji Yamaguchi, San Antonio, TX (US); Pierre Leroux, San Antonio, TX (US)

(73) Assignee: NXP B.V., Eindhoven (NL)

( * ) Notice: Subject to any disclaimer, the term of this patent is extended or adjusted under 35 U.S.C. 154(b) by 811 days.

(21) Appl. No.: 10/841,147

(22) Filed: May 7, 2004

(65) Prior Publication Data

US 2005/0250026 A1    Nov. 10, 2005

(51) Int. Cl.
*G03F 9/00*    (2006.01)
*G01B 11/00*   (2006.01)
*G01B 9/00*    (2006.01)
*G06K 9/00*    (2006.01)
*H01L 23/544*  (2006.01)

(52) U.S. Cl. ............ 430/30; 430/22; 355/53; 355/77; 356/399; 356/400; 356/401; 382/149; 382/151

(58) Field of Classification Search ............. 430/22, 430/30; 355/53, 77; 356/399, 400, 401; 382/149, 151
See application file for complete search history.

(56) References Cited

U.S. PATENT DOCUMENTS

| | | | | |
|---|---|---|---|---|
| 5,757,507 A | * | 5/1998  | Ausschnitt et al. | 356/401 |
| 5,902,703 A | * | 5/1999  | Leroux et al.     | 430/5   |
| 5,962,173 A | * | 10/1999 | Leroux et al.     | 430/5   |
| 5,976,741 A | * | 11/1999 | Ziger et al.      | 430/30  |
| 6,301,008 B1| * | 10/2001 | Ziger et al.      | 356/401 |
| 6,778,275 B2| * | 8/2004  | Bowes             | 356/400 |

* cited by examiner

*Primary Examiner*—Christopher G. Young
(74) *Attorney, Agent, or Firm*—Peter Zawilski

(57) ABSTRACT

The present invention enables the user to measure process line shortening (PLS) on an overlay tool. In an example embodiment (900), to obtain the PLS, the user applies a method to determine the misalignment (MA) of a composite image on a substrate (940*a*), from the composite image the user may determine the total line (940*b*) shortening (TLS) and the equipment line (940*c*) shortening (ELS). The process line shortening (PLS) is determined (940*d*) as a function of TLS and ELS.

15 Claims, 10 Drawing Sheets

OVERLAY BOX STRUCTURE FOR MEASURING PROCESS INDUCED LINE SHORTENING EFFECT

RELATED APPLICATION

This application has been filed concurrently with an application Ser. No. 10/840,922 titled, "Method and Lithographic Structure for Measuring Lengths of Lines and Spaces," of Yuji Yamaguchi, the application assigned to NXP B.V. of The Netherlands, the application is incorporated by reference in its entirety.

FIELD OF THE INVENTION

The invention relates to semiconductor processing. More particularly the invention relates to the measuring of lengths of lines and spaces with lithographic structures.

BACKGROUND

The electronics industry continues to rely upon advances in semiconductor technology to realized higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured for various applications in numerous disciplines. Such silicon-based semiconductor devices often include metal-oxide-semiconductor (MOS) transistors, such as p-channel MOS (PMOS), n-channel MOS (NMOS) and complementary MOS (CMOS) transistors, bipolar transistors, BiCMOS transistors.

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photo resist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma.

Often desired features have particular regions in which the final printed and etched regions have to be accurately reproduced over time. These are referred to as critical dimensions (CDs). As device geometry approaches the sub-micron realm, wafer fabrication becomes more reliant on maintaining consistent CDs over normal process variations. The active device dimensions as designed and replicated on the photo mask and those actually rendered on the wafer substrate have to be repeatable and controllable. In many situations, the process attempts to maintain the final CDs equal to the masking CDs. However, imperfections in the process or changes in technology (that may be realized in a given fabrication process, if the process were "tweaked") often necessitate the rendering of final CDs that deviate from the masking CDs.

U.S. Pat. No. 5,757,507 of Ausschnitt et al. relates generally to manufacturing processes requiring lithography and, more particularly, to monitoring of bias and overlay error in lithographic and etch processes used in microelectronics manufacturing which is particularly useful more monitoring pattern features with dimensions on the order of less than 0.5 micron.

U.S. Pat. No. 5,962,173 of Leroux et al. relates generally to the field of fabricating integrated circuits and more particularly to maintaining accuracy in the fabrication of such circuits having extremely narrow line elements such as gate lines.

U.S. Pat. No. 5,902,703 of Leroux et al. relates generally to the field of fabricating integrated circuits and more particularly to maintaining accuracy in the fabrication of such circuits having relatively narrow line elements such as gate lines. The invention is also directed to the verification of stepper lens fabrication quality.

U.S. Pat. No. 5,976,741 of Ziger et al. relates generally to methods of determining illumination exposure dosages and other processing parameters in the field of fabricating integrated circuits. More particularly, the invention concerns methods of processing semiconductor wafers in step and repeat systems.

U.S. Pat. No. 6,301,008 B1 of Ziger et al. relates to semiconductor devices and their manufacture, and more particularly, to arrangements and processes for developing relatively narrow line widths of elements such as gate lines, while maintaining accuracy in their fabrication.

U.S. Patent Application US 2002/0182516 A1 of Bowes relates generally to metrology of semiconductor manufacturing processes. More particularly, the present invention is a needle comb reticle pattern for simultaneously making critical dimension (CD) measurements of device features and registration measurements of mask overlays relative to semiconductor wafers during processing of semiconductor wafers. This reference and those previously cited are herein incorporated by reference in their entirety.

The references address a number of challenges faced by semiconductor process control engineers in addressing imperfections in the process or changes in technology required to render accurate features (CDs) in a semiconductor device.

SUMMARY OF THE INVENTION

In an example semiconductor process, in gauging the quality of the printing of the CDs in a wafer process, a Scanning Electron Microscope (SEM) is used to measure the lines and space that define CDs. However, the use of a SEM reduces the throughput time in the wafer fabrication, in that the wafer substrate is removed from the production flow. Furthermore, the removed wafer may be unsuitable for production material after SEM analysis. There exists a need for a way to obtain the CD information that does not adversely affect throughput time resulting in additional cost.

In an example embodiment, there is a method for measuring the line shortening of a photolithographic image on a substrate that has been coated with a photo resist. The method comprises developing the photo resist and forming a composite image on the substrate. The composite image comprises a first pattern of spaced lines and rectangles; the space lines and rectangles each have an inner edge and an outer edge. The first pattern surrounds a second pattern of concentric boxes, the concentric boxes include an inside box and an outside box; the inside box has a first edge and a second edge opposite the first edge and the outside box has a first edge and a second edge opposite the first edge. Misalignment (MA) as a function of measurements relative to the edges of the inside box and to the edges of the outside box is determined. Total line shortening (TLS) is determined as a function of measurements relative to the inner edge of the spaced lines and one of the edges of the outside box, and to another edge of the outside box and the rectangle inner edge. As a function of measurements relative to the out edge of the spaced lines, the edges of the outside box, and the out edge of the rectangle, the equipment line shortening (ELS) is determined. Having determined the TLS and ELS, the process line shortening (PLS) is determined as a function of TLS and ELS.

A feature of this embodiment is that the line shortening may be measured in at least the X-direction and the Y-direction. Furthermore, the outer edge of the spaced lines may be defined by a feature edge whose dimensions greatly exceed widths of the spaces and lines of the spaced lines.

In another example embodiment, there is a method for measuring the line shortening of a photolithographic image on a substrate, the substrate having been coated with a photo resist, the method comprises, developing the photo resist and forming a composite image on the substrate. The composite image comprises a first pattern of spaced lines and rectangles; the spaced lines and rectangles each have an inner edge and an outer edge; the first pattern surrounds a second pattern of concentric boxes, the concentric boxes include an inside box and an outside box, the inside box has a first edge and a second edge is opposite the first edge. The outside box has a first edge and a second edge opposite the first edge. Misalignment (MA) is determined as a function of a first distance relative to a second distance; the first distance is measured between the inside box first edge and the outside box first edge. The second distance is measured between the inside box second edge and the outside box second edge. Total line shortening (TLS) is determined as a function of a third distance measured between the inner edge of the spaced lines and one of the edges of the outside box and of a fourth distance measured between another edge of the outside box and the rectangle inner edge. Equipment line shortening (ELS) is determined as a function of a fifth distance and a sixth distance; the fifth distance is measured between the outer edge of the spaced lines and the first edge of the outside box. The sixth distance is measured between the second edge of the outside box and the outer edge of the rectangle. Process line shortening (PLS) is determined as a function of TLS and ELS.

An additional feature of this embodiment includes TLS being equal to the difference between the third distance and the fourth distance. Furthermore, the PLS is the difference between the TLS and ELS. Another additional feature of this embodiment includes that the third distance is measured between the inner edge of the spaced lines and the outside box edge and the fourth distance is measured between the outside box second edge and the rectangle inner edge.

In yet another example embodiment, there is a method for measuring the line shortening of a photolithographic image on a substrate, the substrate having been coated with a photo resist, the method comprises printing a first pattern of space lines and rectangles onto the photo resist coated substrate. A second pattern of a box-in-a-box is printed. The second pattern aligns onto the first pattern. The photo resist is developed forming a composite image on the substrate. The composite image comprises a first pattern of spaced lines and rectangles, the space lines and rectangles each having an inner edge and an outer edge. The first pattern surrounds a second pattern of concentric boxes. The concentric boxes are an inside box and an outside box, the inside box having a first edge and a second edge opposite the first edge and the outside box having a first edge and a second edge opposite the first edge. In a direction of the composite pattern, the misalignment (MA) is determined by measuring a first distance between the inside box first edge and the outside box first edge and a second distance between the inside box second edge and outside box second edge. Subtracting the first distance from the second distance divided by two results in the misalignment. The total line shortening (TLS) is determined in a direction be measuring a first distance between the inner edge of the spaced lines and the outside box first edge and measuring a second distance between the outside box second edge and the rectangle inner edge. Subtracting the first distance from the second distance results in the total line shortening (TLS). The equipment line shortening (ELS) is determined in a direction by measuring a first distance between the outer edge of the spaced lines and the first edge of the outside box and measuring a second distance between the second edge of the outside box and the outer edge of the rectangle. Subtracting the first distance from the second distance results in the equipment line shortening (ELS). Process line shortening (PLS) in a direction is determined by taking the difference between TLS and ELS.

A feature of this embodiment is that direction comprises at least one of the following, the X-direction and the Y-direction.

In yet another example embodiment, there is a system for measuring the line shortening of a photolithographic image on a substrate, the substrate having been coated with a photo resist, the system comprises means for developing the photo resist and forming a composite image on the substrate. The composite image comprises a first pattern of spaced lines and rectangles; the space lines and rectangles each have an inner edge and an outer edge. The first pattern surrounds a second pattern of concentric boxes, the concentric boxes include an inside box and an outside box; the inside box has a first edge and a second edge opposite the first edge and the outside box has a first edge and a second edge opposite the first edge. There are means for determining Misalignment (MA) as a function of measurements relative to the edges of the inside box and to the edges of the outside box. There are means for determining total line shortening (TLS) as a function of measurements relative to the inner edge of the spaced lines and one of the edges of the outside box, and to another edge of the outside box and the rectangle inner edge. As a function of measurements relative to the out edge of the spaced lines, the edges of the outside box, and the out edge of the rectangle, there are means for determining the equipment line shortening (ELS). Having performed the means of determining the TLS and ELS, there are means for determining the process line shortening (PLS) as a function of TLS and ELS.

In yet another example embodiment, there is a system for measuring the line shortening of a photolithographic image on a substrate, the substrate having been coated with a photo resist, the system comprises means for printing a first pattern of spaced lines and rectangles onto the photo resist coated substrate. There are means for printing a second pattern of box-in-a-box aligning the second pattern onto the first pattern. Means for developing the photo resist forms a composite image on the substrate, the composite image comprising a first pattern of spaced lines and rectangles, the spaced lines and rectangles each having an inner edge and an outer edge, the first pattern surrounding a second pattern of concentric boxes, the concentric boxes being an inside box and an outside box, the inside box having a first edge and a second edge opposite the first edge, the outside box having a first edge and a second edge opposite the first edge. There are means for determining the misalignment (MA), means for determining total line shortening (TLS), means for determining the equipment line shortening (ELS), and means for determining process line shortening (PLS).

The above summaries of the present invention are not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

DETAILED DESCRIPTION

The present invention has been found to be useful in the measuring of actual line shortening width using an overlay measurement tool. End of line shortening as observed in a lithographic process is well known. The effect is due to the diffraction of light passing through the corners of open spaces in the reticle. Because of diffraction, the aerial image at the mask edge is steeper and more faithful along the line compared to that on the end of the line. At best focus in the process, there is still some line shortening, though minimized. As focus goes outward from the best focus in either a positive or negative direction, the amount of line shortening increases. Further discussion of line shortening may be found in the paper titled, "*Understanding Optical End of Line Metrology*" (*Optical Engineering*, Vol. 39. No. 7, July 2000, Pages 1951-1957)" by David Ziger and Pierre Leroux, which is herein incorporated by reference in its entirety.

In wafer fabrication, the user may either be using positive or negative photo resist. Consequently, clear-field or dark-field masks may be used. Typically, when a positive resist is used, features defined in the clear-field portions of the mask are removed; the photo resist is de-polymerized upon exposure to the high energy light in the wafer stepper. The developer does not remove the unexposed polymerized photo resist. In other fabrication processes, a negative resist or dark-field masks may be used. However, the principles outlined in the present invention are applicable to whichever mask and resist type. For the purposes of explanation, positive resist is assumed.

When line shortening is measured with an overlay measurement tool, the line shortening comprises process line shortening and equipment line shortening (owing to equipment error). The present invention may measure the process line shortening and equipment line shortening separately.

Figure 1:
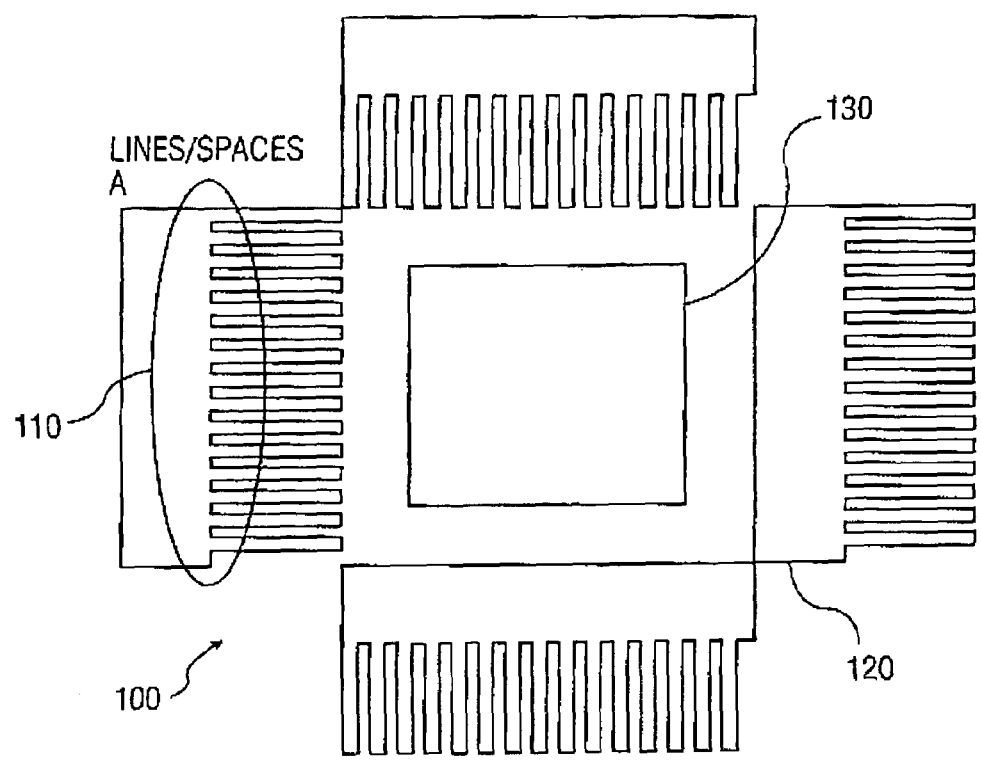
FIG. 1 is a first portion an overlay pattern for the left scribe line having lines and spaces as applied in an embodiment according to the present invention.
Figure 3A:
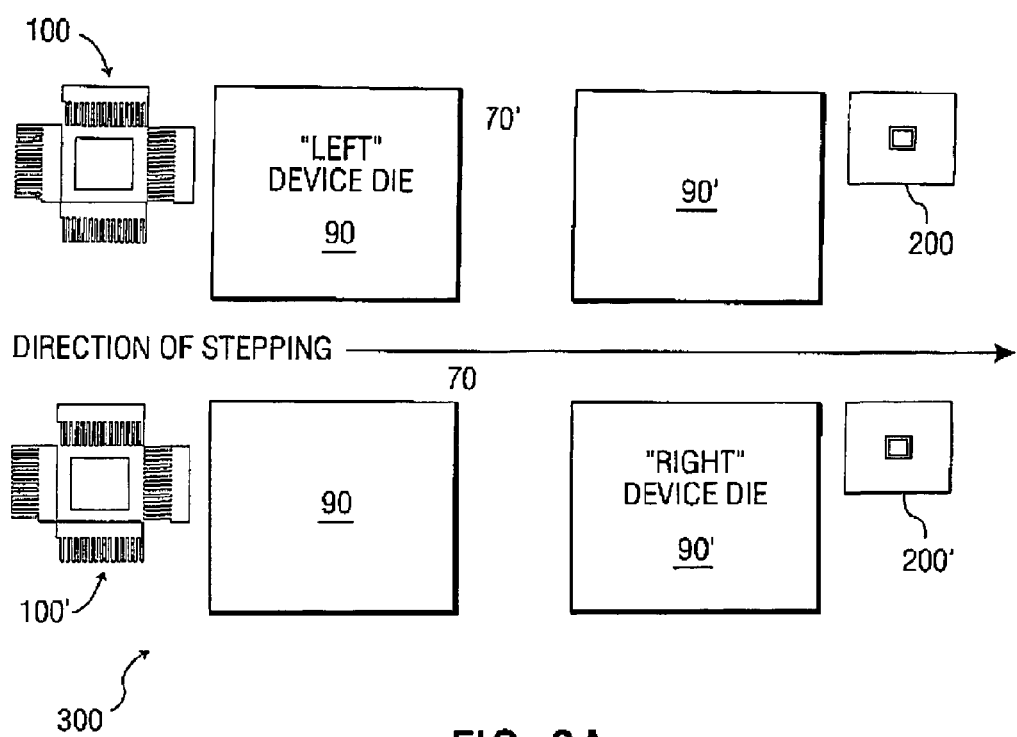
FIG. 3A is an example 2×2 reticle layout showing the orientation of FIG. 1 and FIG. 2 overlay reticle tools in the left and right scribe lanes, respectively.

Refer to FIG. 1. A first portion of an overlay pattern 100 is placed on the extreme left edge of an example 2×2 reticle shot 300 (FIG. 3A). The structure 100 comprises comb-like patterns of lines and spaces 110, rectangles 120, and a square region 130.

Figure 2:
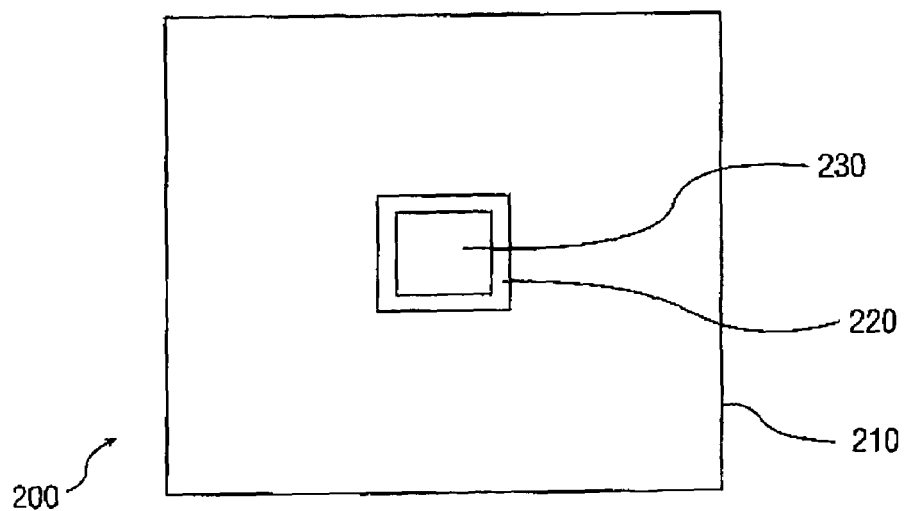
FIG. 2 is a second portion of an overlay pattern for the right scribe line having a box-in-a box as applied in an embodiment according to the present invention.

Refer to FIG. 2. A second scribe-line pattern 200 is placed on the extreme right edge of the reticle shot 300 (FIG. 3A) comprises a box-in-a-box pattern (210, 220, 230). The vertical scribe lanes 70' and horizontal scribe lanes 70 separate the individual product die 90. The die 90 are differentiated by "Left Device Die (90)" and "Right Device Die (90')". The first portion of the overlay pattern 100, 100' and the second portion of the overlay pattern 200, 200' are in their respective locations. FIG. 3A depicts the stepping of the pattern in the horizontal direction only, as denoted by the arrow drawn in the horizontal scribe lane 70. Similarly, the stepping and orientation of the overlay patterns are adjusted for the vertical direction, as well.

Figure 3B:
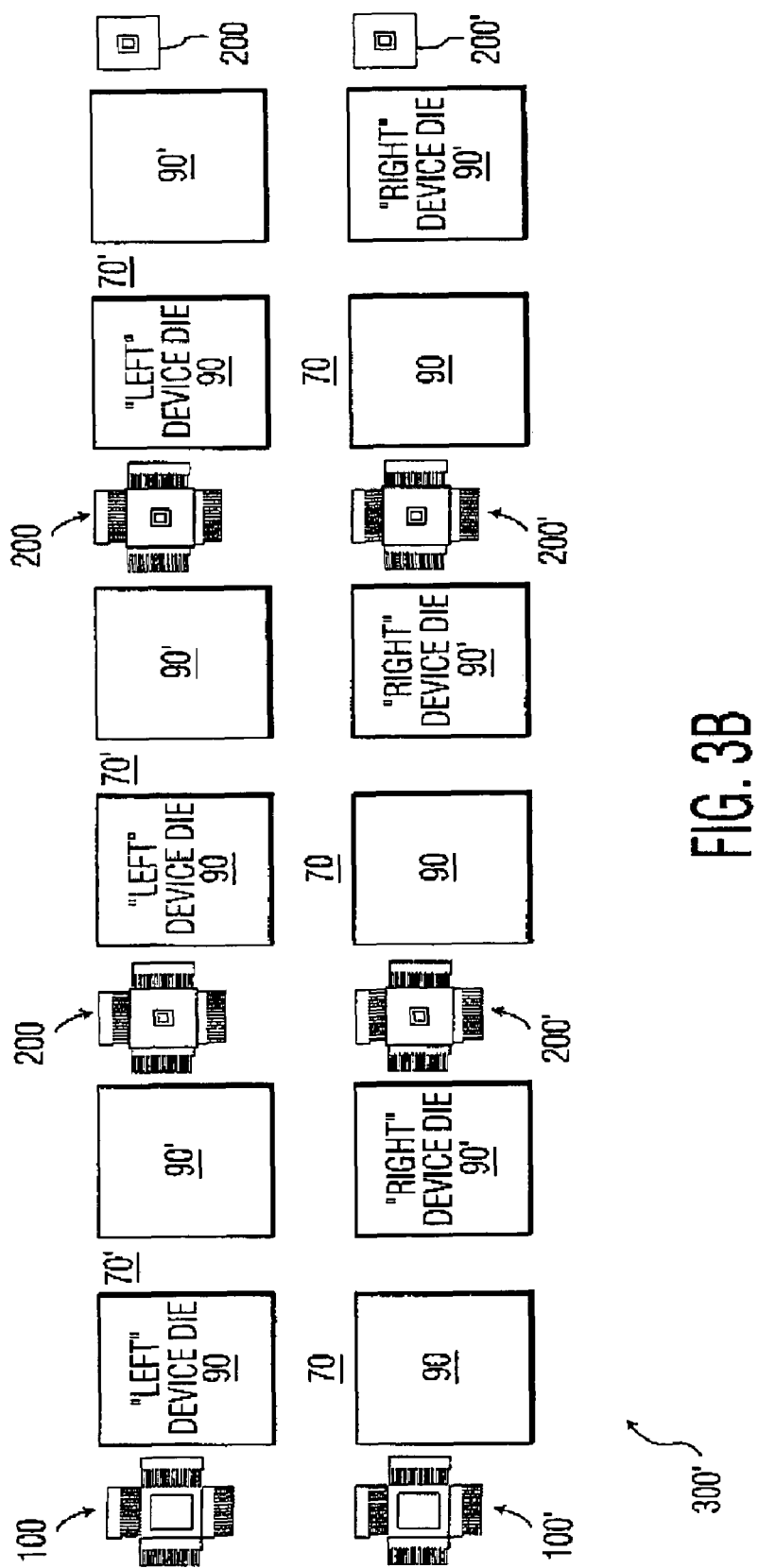
FIG. 3B shows the exposure of FIG. 1 over FIG. 2 as the 2×2 reticle is stepped across the wafer substrate according to an embodiment of the present invention.

The lithographic structure according to an embodiment of the present invention is built using an overlapping exposure process. The first scribe line pattern 100 is exposed over the second scribe line pattern 200 of an adjacent field and/or top and bottom field. Refer to FIG. 3B. Multiple reticle shots 300' illustrate the overlap of the scribe-line pattern 100 with the scribe-line pattern of 200. The order of exposing FIG. 1 and FIG. 2 may be reversed depending upon a given process. The wavelength of the light used to expose the patterns predicates the dimensions of the structure used. For example, a 365 nm wavelength, one may use 0.35 µm lines/spaces. For a 248 nm wavelength, one may use about 0.25 µm lines/spaces. For a 193 nm wavelength, lines/spaces of about 0.12 µm are used and for a 157 µm wavelength, lines/spaces of about 0.09 µm are used.

Figure 3C:
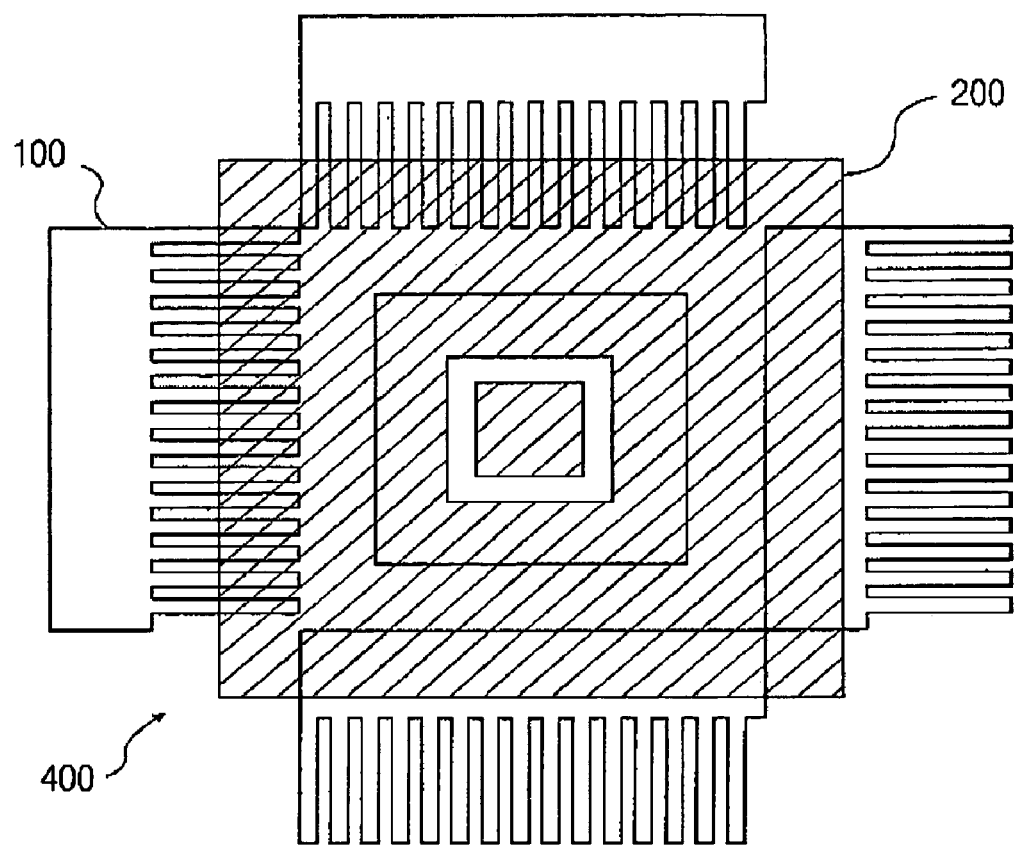
FIG. 3C is a close-up of the combination of the patterns of FIG. 1 and FIG. 2, as stepped across the wafer of FIG. 3B.
Figure 3D:
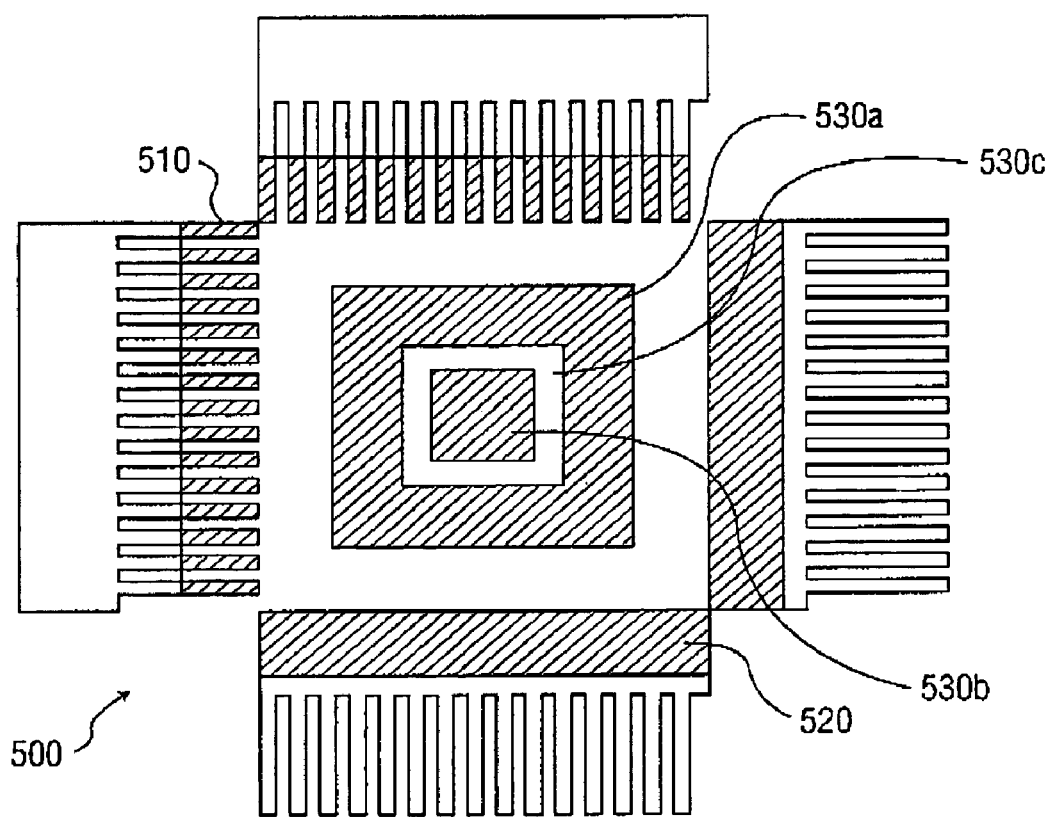
FIG. 3D is the combination of FIG. 1 and FIG. 2 after the resist is developed, the darker parts of figure only remain.

Refer to FIG. 3C. The structure 400 depicts the overlapping layers 100 and 200. Upon developing the exposed resist, only the dark portions of 500 remain (FIG. 3D). The remaining parts are lines/spaces 510, rectangles 520, and a box-in-a-box structure (530a, 530b, 530c).

Figure 4:
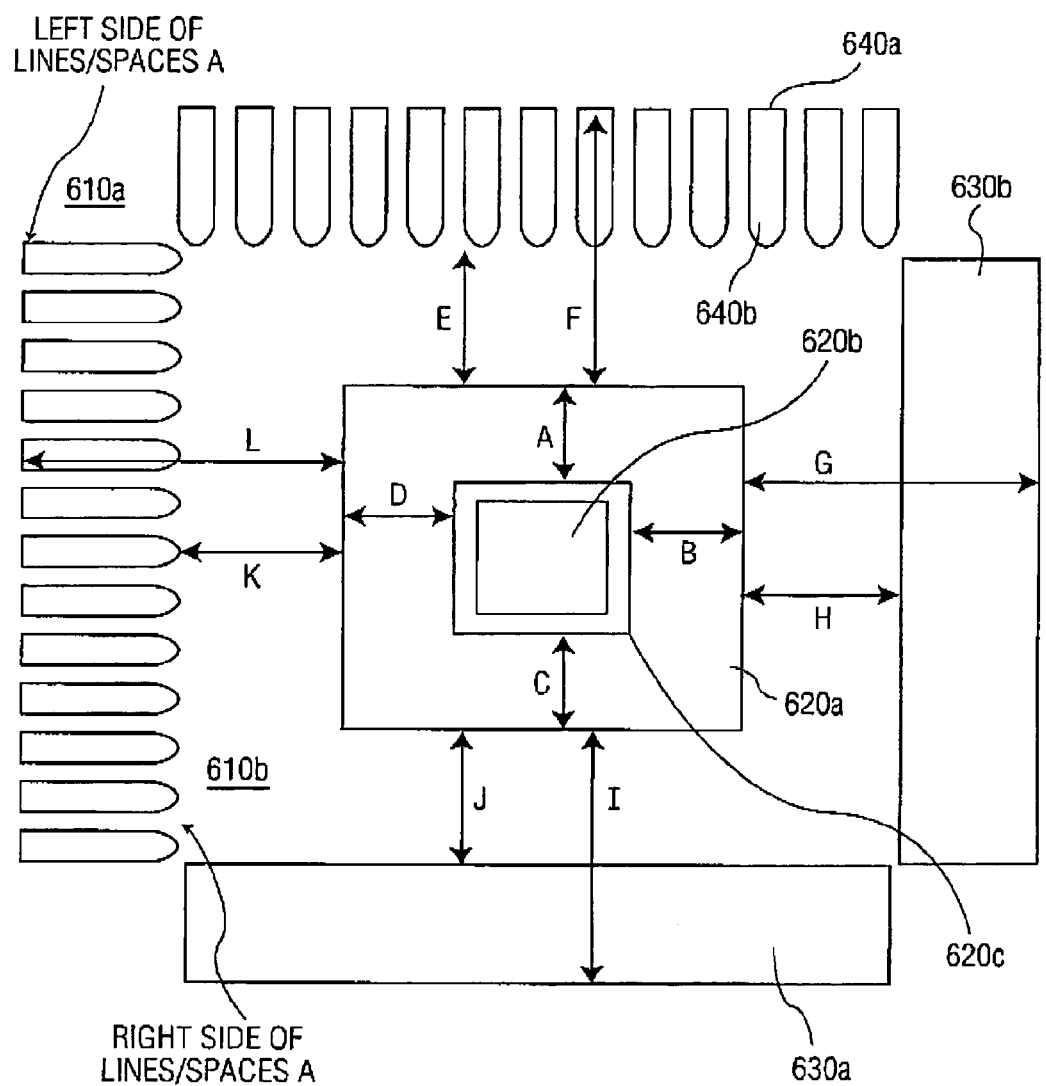
FIG. 4 is enlarged version of FIG. 3D indicating regions of "line shortening;"

Refer to FIG. 4. Zooming into the remaining structure after develop, the structure 600 has the lines/space A 610a have been cut by the edge of Block A (200) on the left side only. Because the edge of Block A block of FIG. 2 is part of a large feature, it can be printed at the exact "design location," a line shortening effect on the left side of lines/ spaces A 610a is not observed. However, on the right side of lines/spaces A 610b, line-shortening effect is observed, by the rounding of the features. This line shortening is due to the diffraction effects of the lines/spaces and the incident light used to expose the photo resist. The CDs of the features are approaching the wavelength of the light. By applying this effect between the left side and right side, the actual line shortening from the process may be measured.

The center box-in-a-box measures the overlapping misalignment that may happen in both X and Y directions as the user overlaps the left scribe pattern (FIG. 1) onto the right scribe pattern (FIG. 2). These overlay measurements may be done in a conventional overlay tool.

Figure 5:
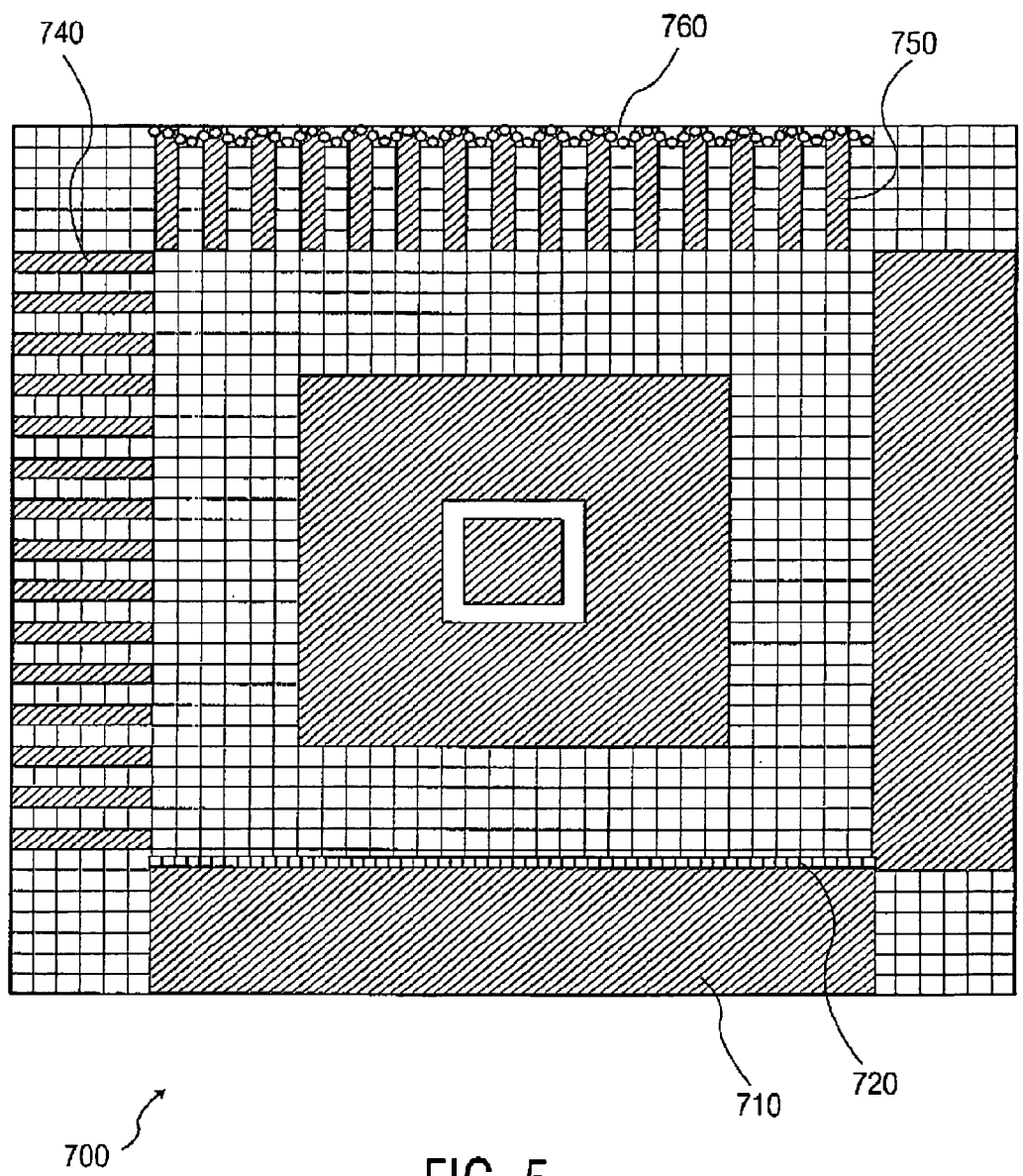
FIG. 5 illustrates what the overlay tool sees at edge locations between lines and spaces.

It has been determined that an overlay measurement (such as the KLA5105 manufactured by KLA/Tencor Corporation) does not measure the edge of lines and spaces exactly at the end of the lines but at some distance inside the lines and spaces patterns. The depth at which the measurement is made depends upon the size of the lines and spaces. The overlay tool sees the edge location of the lines and spaces as a sinusoidal shape. The overlay tool averages the sinusoidal shape as a straight-line, the resulting averaged value being much larger than what it really is. Refer to FIG. 5. The pattern 700 has lines and spaces (740, 750) and rectangle 710. The overlay tool is averaging the sinusoidal pattern 760 (dots are catching the edge created by equally spaced lines) while rectangles are catching the solid straight edge 720.

Figure 6:
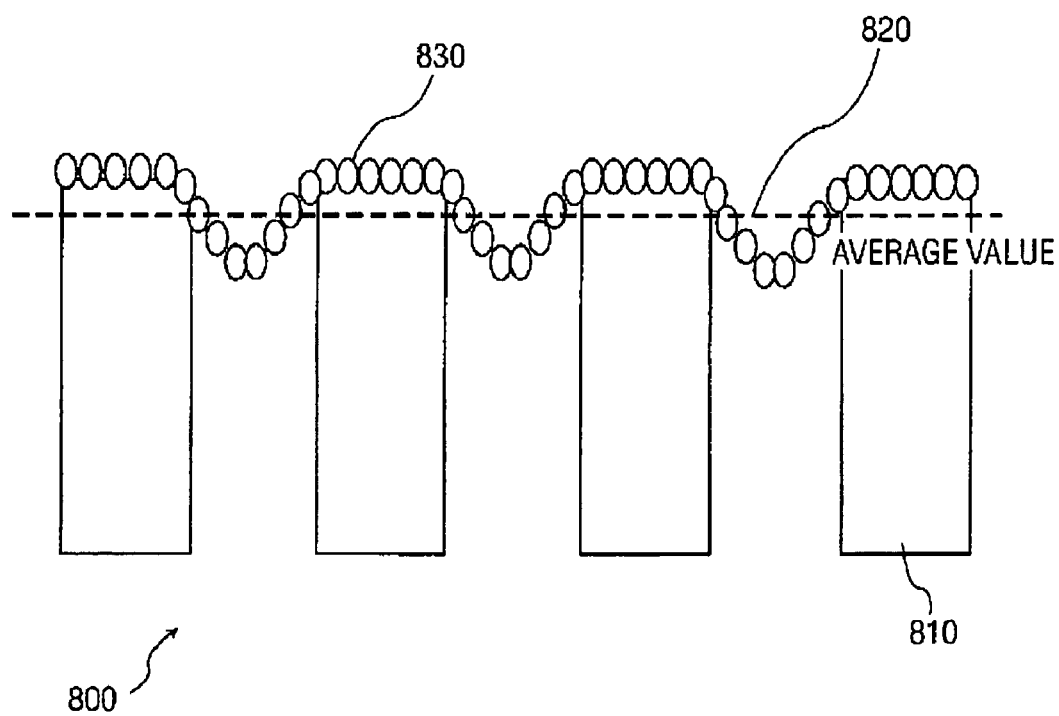
FIG. 6 is a close-up of FIG. 5.

Refer to FIG. 6. A close up of the line and space pattern 800 reveals that the overlay tools catches measurement points 830 at a greater depth in the spaces between the lines 810. Consequently, the averaged line shortening value 820 is much larger than it really is.

Figure 7:
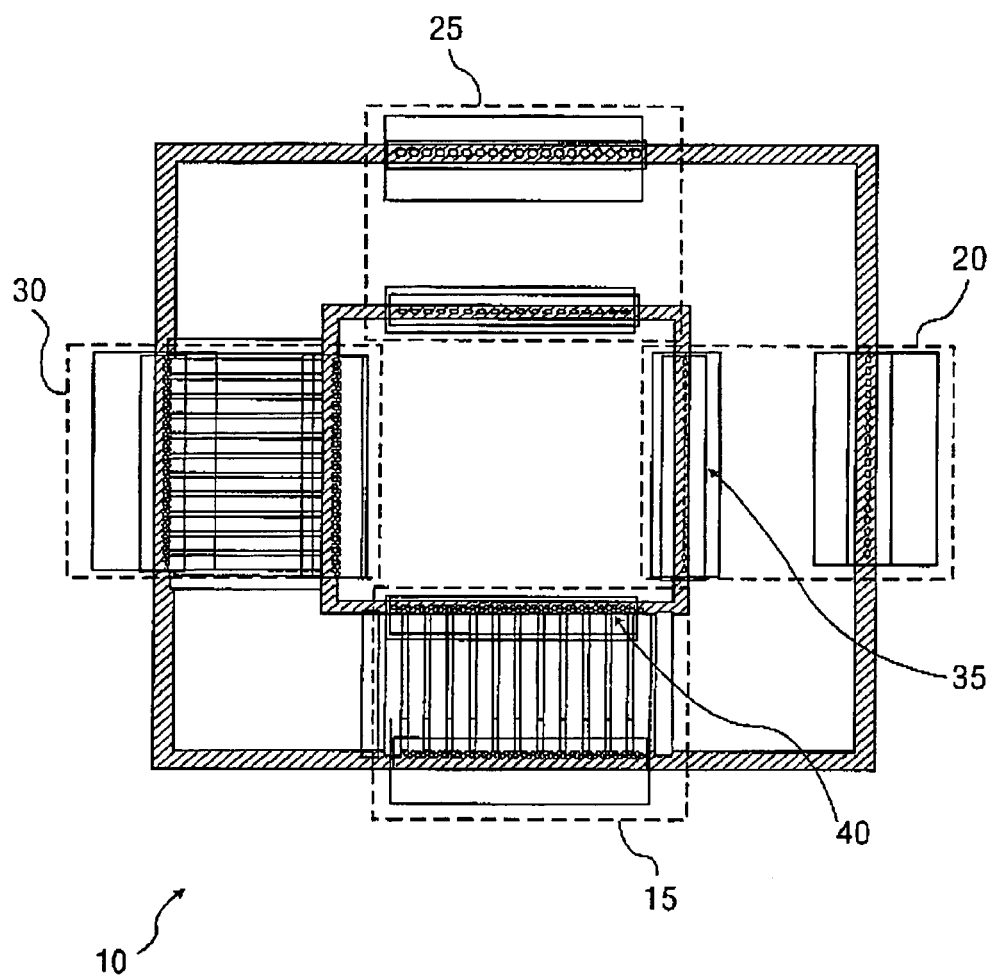
FIG. 7 illustrates where an overlay measurement tool resolves the line as it measures solid bar and line/spaces bar as observed in FIG. 6.

Refer to FIG. 7. The structure 10 depicts an example of how a KLA/Tencor overlay measurement tool resolves the straight edge (and line/space edge) of structures discussed earlier. Dashed boxes 15 and 25 are measurements in the Y-direction, while dashed boxes 20 and 30 are measurements in the X-direction. The measurement of a straight line is shown at 35. The measurement of lines and spaces is shown at 40. It is useful to discuss a number of parameters associated with the present invention. In an example process according to the present invention, there are a series of steps the user may perform to obtain the parameters to determine the process line shortening.

Figure 8:
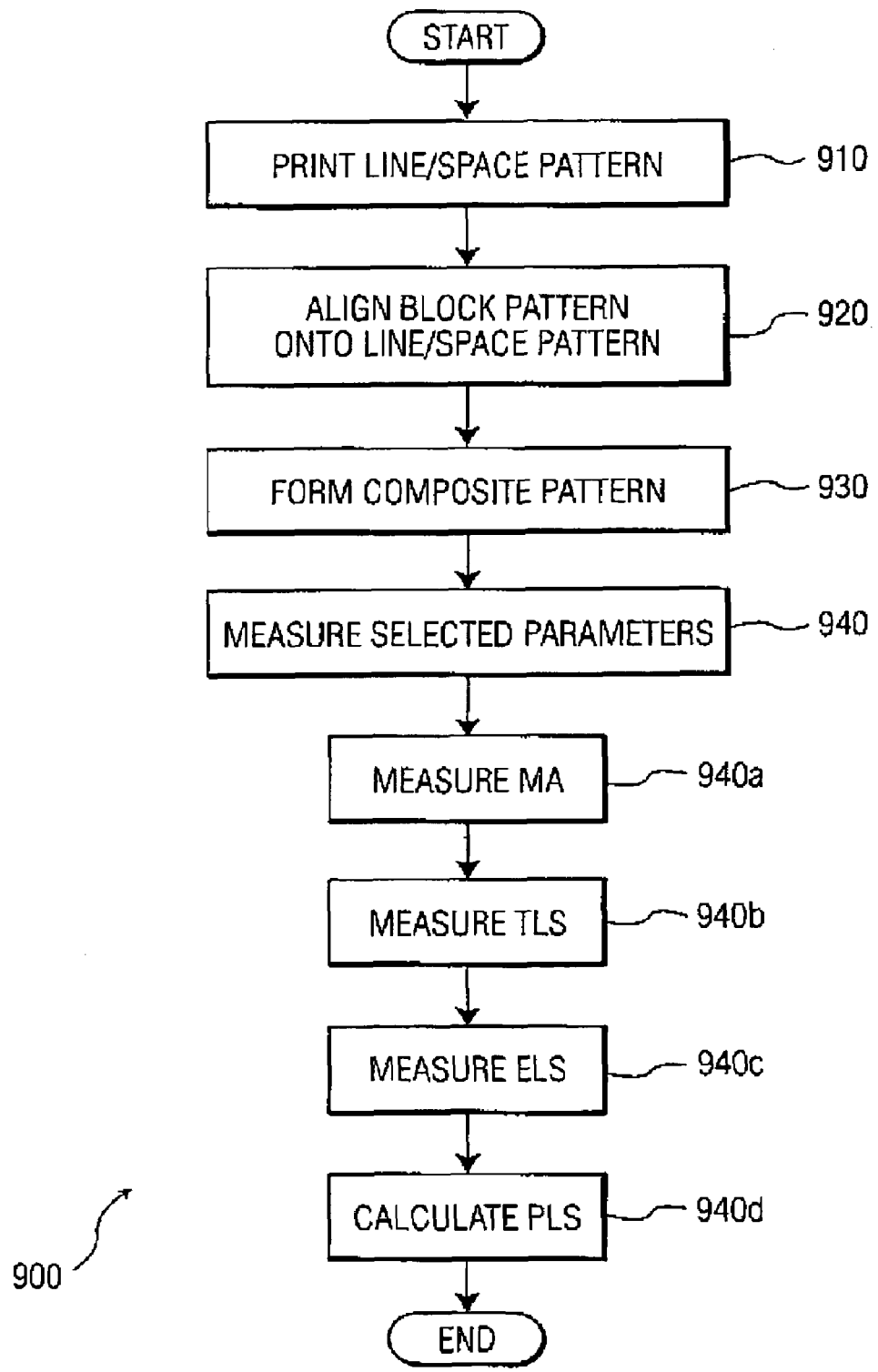
FIG. 8 is a flowchart outlining the steps in calculating Process Line Shortening according to an embodiment of the present invention.

Refer to FIG. 8. In a series of steps 900, the user prints a line/space pattern 910 (such as that depicted in FIG. 1). Next, a block pattern is aligned onto the line/space pattern 920 forming a composite pattern 930. Selected parameters are obtained 940. Below the specific parameters are discussed in further detail.

940a. Misalignment due to overlapping scribe lines (MA). Refer back to FIG. 4. The frame box which uses sides A, B, C, and D, is created from two scribe lines The frame box is used so that the user we can set up an overlay job in which the tool resolves the center of the frame, the inner edge of the frame, or the outer edge of the frame. If the scribe lines are exposed with perfect alignment, the equations below should equal zero. However, if there is a misalignment, (B−D) or (A−C) should be either a negative or positive value depending on which way the misalignment is shifted. The values are divided by two; the distance of (B−D) or (A−C) is the total misalignment and the box should actually be shifted by half of those values.

$(MA)_x = (B-D)/2$ $(MA)_y = (A-C)/2$

940b. Total Line Shortening (TLS). When a distance K is compared to the distance H, that difference between the two values would be the total line shortening in the X-direction because the shortening is caused by the photo lithography process itself and by the overlay tool measurement at the edge of the equally spaced lines 610b. Similarly, the total line shortening in the Y-direction is the difference between E and J, E being the edge of the equally spaced lines 640b.

$(TLS)_x = K-H$ $(TLS)_y = E-J$

940c. Equipment Line Shortening (ELS). The difference between L and G (in the case of no misalignment) is only caused by the equipment error from an overlay measurement tool because the outer edge 610a of the equally spaced lines are cut by a block (the structure 200 of FIG. 2) and the location of the cut is at the design location. The process is set-up in a way that those edges are as per the design location. We do not see process line shortening at this location. The diffraction effects at the edge of the defined feature are nil because the defined feature (the block) has dimensions far exceeding the wavelength of the light used in the photolithography. In the Y-direction, the ELS is the difference between F and I and in the X-direction the ELS is L and G.

$(ELS)_x = (G-L) + (MA)_x$ $(ELS)_x = (G-L) + [(B-D)/2]$ $(ELS)_y = (I-F) + (MA)_y$ $(ELS)_y = (I-F) + [(A-C)/2]$

940d. The difference between TLS (840b) and ELS (840c) is the Process Line Shortening (PLS). TLS is caused by both the equipment error and process itself. ELS is the line shortening only due equipment error. The difference between these two values is the line shortening due to the process. When there is a misalignment, the amount of misalignment must be added or subtracted depending on which direction the alignment is shifted.

$(PLS)_x = (TLS)_x - (ELS)_x$ $(PLS)_x = (K-H) - \{(G-L) + [(B-D)/2]\}$ $(PLS)_y = (TLS)_y - (ELS)_y$ $(PLS)_y = (K-H) - \{(G-L) + [(B-D)/2]\}$

In an example process, a line width of about 0.16 µm as seen by KLA is measured as about 0.04 µm as measured on HITACHI SEM 7280. It differs by a about a factor of four.

While the present invention has been described with reference to several particular example embodiments, those skilled in the art will recognize that many changes may be made thereto without departing from the spirit and scope of the present invention, which is set forth in the following claims.

The invention claimed is:

1. A method for measuring the line shortening of a photolithographic image on a substrate, the substrate having been coated with a photo resist, the method comprising:
   developing the photo resist and forming a composite image on the substrate, the composite image comprising a first pattern of spaced lines and rectangles, the spaced lines and rectangles each having an inner edge and an outer edge, the first pattern surrounding a second pattern of concentric boxes, the concentric boxes including an inside box and an outside box, the inside box having a first edge and a second edge opposite the first edge, the outside box having a first edge and a second edge opposite the first edge;

determining misalignment (MA) as a function of measurements relative to the edges of the inside box and to the edges of the outside box;

determining total line shortening (TLS) as a function of measurements relative to the inner edge of the spaced lines and one of the edges of the outside box, and to another edge of the outside box and the rectangle inner edge;

determining equipment line shortening (ELS) as a function of measurements relative to the outer edge of the spaced lines, the edges of the outside box, and the outer edge of the rectangle; and determining process line shortening (PLS) as a function of TLS and ELS.

2. The method of claim 1, wherein the line shortening is measured in at least one of the following directions: the X-direction and the Y-direction.

3. The method of claim 1 wherein, the outer edge of the spaced lines has been defined by a feature edge whose dimensions greatly exceed widths of spaces and lines of the spaced lines.

4. The method of claim 1 wherein the spaced lines are the same distance from one another.

5. The method of claim 1 wherein the spaced lines have dimensions of near the wavelength of light used to expose the photo resist.

6. A method for measuring the line shortening of a photolithographic image on a substrate, the substrate having been coated with a photo resist, the method comprising:

developing the photo resist and forming a composite image on the substrate, the composite image comprising a first pattern of spaced lines and rectangles, the spaced lines and rectangles each having an inner edge and an outer edge, the first pattern surrounding a second pattern of concentric boxes, the concentric boxes including an inside box and an outside box, the inside box having a first edge and a second edge opposite the first edge, the outside box having a first edge and a second edge opposite the first edge;

determining misalignment (MA) as a function of a first distance relative to a second distance, the first distance measured between the inside box first edge and the outside box first edge, and the second distance measured between the inside box second edge and outside box second edge;

determining total line shortening (TLS) as a function of a third distance measured between the inner edge of the spaced lines and one of the edges of the outside box, and of a fourth distance measured between another edge of the outside box and the rectangle inner edge;

determining equipment line shortening (ELS) as a function of a fifth distance and a sixth distance, the fifth distance measured between the outer edge of the spaced lines and the first edge of the outside box, the sixth distance measured between the second edge of the outside box and the outer edge of the rectangle; and determining process line shortening (PLS) as a function of TLS and ELS.

7. The method of claim 6, wherein TLS is equal to the difference between the third distance and the fourth distance.

8. The method of claim 6, wherein PLS is equal to the difference between TLS and ELS.

9. The method of claim 6, wherein the third distance is measured between the inner edge of the spaced lines and the outside box first edge, and wherein the fourth distance is measured between the outside box second edge and the rectangle inner edge.

10. A method for measuring the line shortening of a photolithographic image on a substrate, the substrate having been coated with a photo resist, the method comprising:

printing a first pattern of spaced lines and rectangles onto the photo resist coated substrate;

printing a second pattern of box-in-a-box aligning the second pattern onto the first pattern;

developing the photo resist, forming a composite image on the substrate, the composite image comprising a first pattern of spaced lines and rectangles, the spaced lines and rectangles each having an inner edge and an outer edge, the first pattern surrounding a second pattern of concentric boxes, the concentric boxes being an inside box and an outside box, the inside box having a first edge and a second edge opposite the first edge, the outside box having a first edge and a second edge opposite the first edge;

determining misalignment (MA) in a direction of the composite pattern by measuring a first distance between the inside box first edge and the outside box first edge and a second distance between the inside box second edge and outside box second edge, subtracting the first distance from the second distance, resulting in the misalignment.

determining total line shortening (TLS) in a direction by measuring a first distance between the inner edge of the spaced lines and the outside box first edge, measuring a second distance between outside box second edge and rectangle inner edge, subtracting the first distance from the second distance, resulting in a difference, resulting in the total line shortening;

determining the equipment line shortening (ELS) in a direction by measuring a first distance between the outer edge of the spaced lines and the first edge of the outside box, measuring a second distance between the second edge of the outside box and the outer edge of the rectangle, subtracting the first distance from the second distance, resulting in the equipment line shortening; and determining process line shortening (PLS) in a direction by taking the difference between TLS and ELS.

11. The method of claim 10, wherein the direction comprises at least one of the following, the X-direction and the Y-direction.

12. The method of claim 10 wherein, the outer edge of the spaced lines has been defined by a feature edge whose dimensions greatly exceed widths of spaces and lines of the spaced lines.

13. The method of claim 10 wherein the spaced lines are the same distance from one another.

14. A system for measuring the line shortening of a photolithographic image on a substrate, the substrate having been coated with a photo resist, the system comprising:

means for developing the photo resist and forming a composite image on the substrate, the composite image comprising a first pattern of spaced lines and rectangles, the spaced lines and rectangles each having an inner edge and an outer edge, the first pattern surrounding a second pattern of concentric boxes, the concentric boxes including an inside box and an outside box, the inside box having a first edge and a second edge opposite the first edge, the outside box having a first edge and a second edge opposite the first edge;

means for determining misalignment (MA) as a function of measurements relative to the edges of the inside box and to the edges of the outside box;

means for determining total line shortening (TLS) as a function of measurements relative to the inner edge of the spaced lines and one of the edges of the outside box, and to another edge of the outside box and the rectangle inner edge;

means for determining equipment line shortening (ELS) as a function of measurements relative to the outer edge of the spaced lines, the edges of the outside box, and the outer edge of the rectangle; and means for determining process line shortening (PLS) as a function of TLS and ELS.

15. System for measuring the line shortening of a photolithographic image on a substrate, the substrate having been coated with a photo resist, the system comprising:

means for printing a first pattern of spaced lines and rectangles onto the photo resist coated substrate;

means for printing a second pattern of box-in-a-box aligning the second pattern onto the first pattern;

means for developing the photo resist, forming a composite image on the substrate, the composite image comprising a first pattern of spaced lines and rectangles, the spaced lines and rectangles each having an inner edge and an outer edge, the first pattern surrounding a second pattern of concentric boxes, the concentric boxes being an inside box and an outside box, the inside box having a first edge and a second edge opposite the first edge, the outside box having a first edge and a second edge opposite the first edge;

means determining misalignment (MA);

means for determining total line shortening (TLS);

means for determining the equipment line shortening (ELS); and means for determining process line shortening (PLS).

* * * * *